(12) United States Patent
Otsuka et al.

(10) Patent No.: US 7,893,539 B2
(45) Date of Patent: Feb. 22, 2011

(54) SEMICONDUCTOR APPARATUS AND MOBILE APPARATUS

(75) Inventors: Takeshi Otsuka, Hashima (JP); Toshikazu Imaoka, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 324 days.

(21) Appl. No.: 12/022,840

(22) Filed: Jan. 30, 2008

(65) Prior Publication Data
US 2008/0211110 A1    Sep. 4, 2008

(30) Foreign Application Priority Data

Jan. 31, 2007 (JP) ............................. 2007-020683
Jan. 22, 2008 (JP) ............................. 2008-011473

(51) Int. Cl.
*H01L 23/48* (2006.01)
(52) U.S. Cl. ................ 257/777; 257/686; 257/778; 257/E23.101; 257/E25.006
(58) Field of Classification Search ................. 257/777, 257/686, 778, E23.101, E25.006
See application file for complete search history.

(56) References Cited

U.S. PATENT DOCUMENTS

| 2007/0132084 A1* | 6/2007 | Sung et al. ................... 257/686 |
| 2008/0174030 A1* | 7/2008 | Liu et al. ..................... 257/777 |
| 2009/0166887 A1* | 7/2009 | Upadhyayula et al. ...... 257/777 |

FOREIGN PATENT DOCUMENTS

JP    11-204720    7/1999

* cited by examiner

*Primary Examiner*—Long K Tran
(74) *Attorney, Agent, or Firm*—Fish & Richardson P.C.

(57) ABSTRACT

A semiconductor apparatus includes: a wiring board; a first semiconductor device mounted on the wiring board; a second semiconductor device which is stacked on the first semiconductor device and a projection part projects from the outer edge of the first semiconductor device; and a sealing resin layer which seals each semiconductor device. And the second semiconductor device has thereon a first analog cell, and a second analog cell which reaches a higher temperature than the first analog cell, and the second analog cell is arranged so as to include the projection part of the second semiconductor device.

8 Claims, 12 Drawing Sheets

SEMICONDUCTOR APPARATUS AND MOBILE APPARATUS

CROSS-REFERENCE TO RELATED APPLICATIONS

This application is based upon and claims the benefit of priority from the prior Japanese Patent Applications No. 2007-020683, filed Jan. 31, 2007, and Japanese Patent Application No. 2008-011473, filed Jan. 22, 2008, the entire contents of which are incorporated herein by reference.

BACKGROUND OF THE INVENTION

1. Field of the Invention

The present invention relates to a semiconductor apparatus, in particular, to a semiconductor apparatus with a plurality of semiconductor devices being built.

2. Description of the Related Art

Recently, as a packaging technology in which miniaturization and high performance of semiconductor apparatuses used in electronic equipment can be realized, a multi stack structure (a multi chip package structure) has been known, in which a plurality of semiconductor devices (e.g. semiconductor chips) are mounted by lamination.

FIG. 4 is a schematic section showing a semiconductor apparatus having a conventional stack structure. In this semiconductor apparatus, a first semiconductor chip 1110 having a relatively large area is fixed onto a wiring board (interposer) 1140 by a die bond material 1112, and a second semiconductor chip 1120 is fixed onto the first semiconductor chip 1110 by a die bond material 1122 not so as to interfere with an electrode pad 1113 of the first semiconductor chip 1110.

The electrode pad 1113 formed on the upper surface of the first semiconductor chip 1110 is electrically connected with a pad electrode 1143 formed on the wiring board 1140 by a bonding wire 1114 made of gold wiring or the like. And a pad electrode 1123 on the upper surface of the second semiconductor chip 1120 is electrically connected with the pad electrode 1143 by a bonding wire 1124.

The first semiconductor chip 1110 stacked on the wiring board 1140 and the second semiconductor chip 1120 are sealed by a sealing resin layer 1150. An external connection terminal 1145 electrically connected with the pad electrode 1143 is formed on the underside (undersurface) of the semiconductor chip mounting surface of the wiring board 1140.

A semiconductor apparatus having a stack structure described above, when mounted on a print wiring board and used, can reduce an area for mounting in a planar direction as compared with the case where a plurality of semiconductor devices (semiconductor chips) are arranged on a plane, therefore the semiconductor apparatus can meet the demand for miniaturization and high integration of electronic equipment.

However, in a semiconductor apparatus which adopts a stack structure to achieve such miniaturization and high integration thereof, and in particular, in the case of a semiconductor apparatus which adopts a semiconductor device having a circuit area which consumes more power (heat generating circuit area), there is a concern that a wrong operation might occur or the apparatus be destroyed, if heat release to the outside is insufficient when the temperature of the circuit area abruptly rises.

SUMMARY OF THE INVENTION

In view of these circumstances, the present invention has been made, and a general purpose of the invention is to provide a technique which increases the heat release capability of a semiconductor apparatus having devices built and improves the reliability thereof.

To solve the above problem, a semiconductor apparatus in an embodiment of the present invention includes: a first semiconductor device; and a second semiconductor device which is stacked on the first semiconductor device and has a projection part projecting from the outer edge of the first semiconductor device, wherein the second semiconductor device has thereon a first circuit area, and a second circuit area which reaches a higher temperature than the first circuit area, and the second circuit area is arranged so as to include the projection part.

In the above structure, the first semiconductor device and the second semiconductor device are arranged on a substrate and are sealed by a resin layer formed on the substrate. The resin layer is preferably formed so that a distance between the edge portion including the second circuit area of the second semiconductor device and a side wall surface of the resin layer corresponding thereto, is shorter than that of any other edge portion.

In the above structure, an amount of current flowing through a first wiring connecting an electrode portion included in the first circuit area with a terminal provided on the substrate, is preferably lower than that flowing through a second wiring connecting an electrode portion included in the second circuit area with a terminal provided on the substrate.

In the above structure, the terminal provided on the substrate, with which the second wiring is connected, is preferably provided in an area other than the area between the edge portion including the second circuit area and the side wall surface of the resin layer corresponding thereto.

In the above structure, the resin layer is preferably formed so that a distance between the edge portion and the side wall surface of the resin layer corresponding thereto, is shorter than that between the upper surface of the second semiconductor device and the upper surface of the resin layer.

In the above structure, the second semiconductor device is preferably stacked on the first semiconductor device so that multiple sides of the second semiconductor device project from the outer edge of the first semiconductor device, and more preferably stacked on the same so that four sides of the second semiconductor device project from the outer edge of the first semiconductor device.

In the above structure, the first semiconductor device is preferable provided with a plurality of projecting electrode terminals to be connected with the substrate, on the surface opposite to the surface where the second semiconductor device is built.

In the above structure, the second circuit area preferably includes an electrode portion which is arranged in an area where the first semiconductor device and the second semiconductor device are superposed on each other.

In the above structure, the second circuit area preferably includes an electrode portion which is arranged in the projection part.

Another embodiment of the present invention is a mobile apparatus. The mobile apparatus is preferably provided with any one of the semiconductor apparatuses described above.

DETAILED DESCRIPTION OF THE INVENTION

The invention will now be described by reference to the preferred embodiments. This does not intend to limit the scope of the present invention, but to exemplify the invention.

A description will now be given of the embodiments which embody the present invention, with reference to the accompanying drawings. In the all drawings, like numerals represent like constituting elements, and the description thereof is omitted appropriately.

First Embodiment

Figure 1:
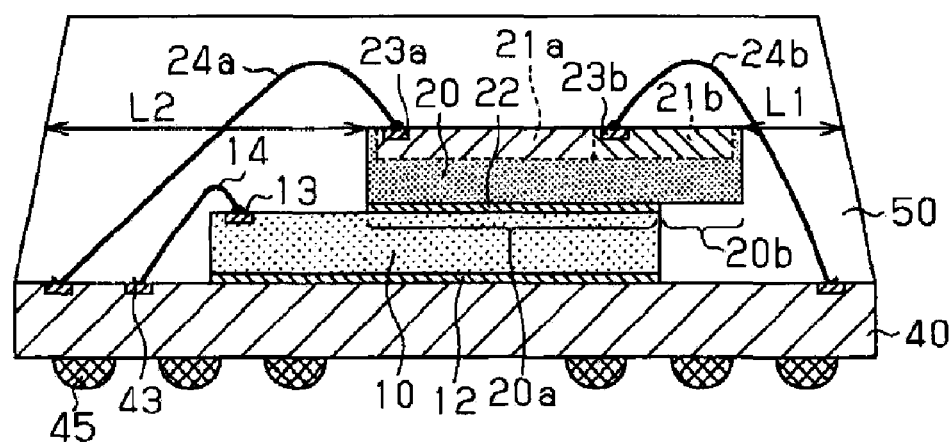
FIG. 1 is a schematic section of a semiconductor apparatus having semiconductor devices built according to the present embodiment.
Figure 2:
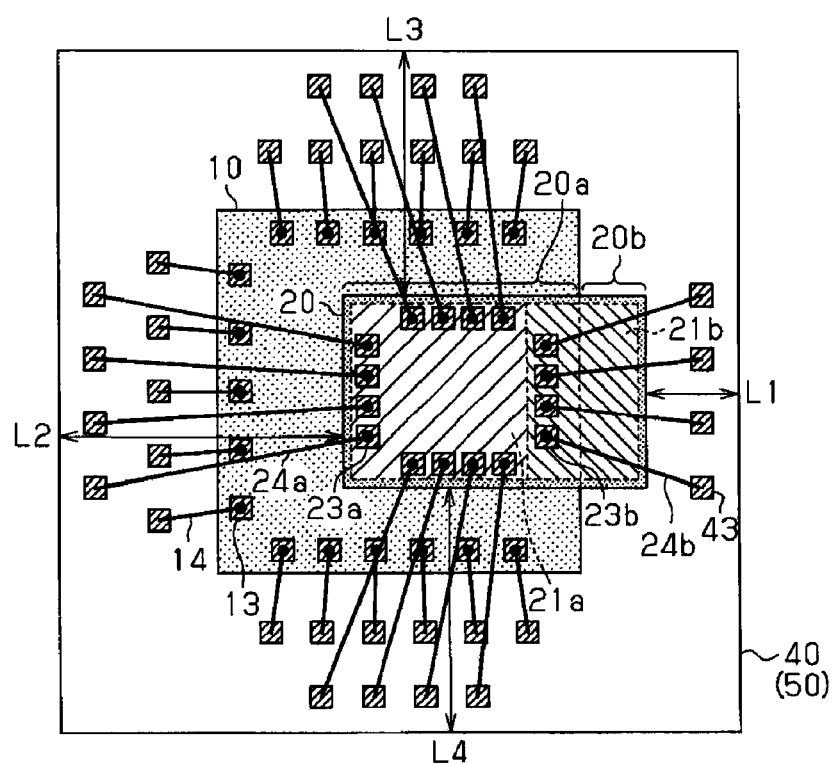
FIG. 2 is a plan view of a semiconductor apparatus according to the present invention.

FIG. 1 is a schematic section of a semiconductor apparatus having semiconductor devices built according to the first embodiment, and FIG. 2 is a plan view (top view) of the semiconductor apparatus.

A semiconductor apparatus according to the present embodiment includes: a wiring board 40; a first semiconductor device 10 mounted on the wiring board 40; a second semiconductor device 20 which is stacked on the first semiconductor device 10 and a projection part 20b projects from the outer edge of the first semiconductor device 10; and a sealing resin layer 50 which seals each semiconductor device. And the second semiconductor device 20 has thereon a first analog cell 21a, and a second analog cell 21b which is easy to generate heat at a temperature higher than that of the first analog cell 21a, and the second analog cell 21b is arranged so as to include the projection part 20b of the second semiconductor device 20. The first analog cell 21a and the second analog cell 21b may be on the undersurface or on the periphery edge portion of the second semiconductor device 20, without being limited to the upper surface thereof.

As the wiring board 40, a multi-layer base board is used in which a plurality of wiring layers and insulating layers are alternately formed. On the upper surface (semiconductor device mounting surface) of the wiring board 40, a plurality of pad electrodes 43 made of copper (Cu), nickel (nickel), and gold (Au) are formed, while on the undersurface (surface opposite to the semiconductor device mounting surface), an external connection terminal (solder ball) 45 electrically connected with the pad electrode 43 via the internal wiring layer (not shown) is formed.

The first semiconductor device 10 is one in which, for example, a digital system circuit (not shown) is formed on the upper surface (surface) of a semiconductor substrates, such as p-type silicon substrate, and is mounted in a predetermined area on the wiring board 40 via an adhesive layer 12, such as a die attach film. The digital system circuit collectively refers to circuits which use a signal of a digital value as data, and examples of the digital system circuits include, for example, an arithmetic circuit composed of various types of logic circuits, a CPU, a memory, an analog/digital converter (ADC) circuit, a digital/analog converter (DAC) circuit, a digital filter circuit, and a phase lock loop (PLL) circuit or the like. In addition, a plurality of pad electrodes 13, which are electrically connected with a digital system circuit to communicate a signal with the outside of the semiconductor device, are arranged in an outer edge part (outer edge part other than the side where the second semiconductor device 20 is mounted) of the first semiconductor device 10. The pad electrode 13 is electrically connected with the pad electrode 43 on the upper surface of the wiring board 40 by a bonding wire 14 such as gold.

The second semiconductor device 20 is one where an analog system circuit including the first analog cell 21a and the second analog cell 21b, is formed on the upper surface (surface) of a semiconductor substrate, for example, p-type silicon substrate etc. The second semiconductor device 20 is mounted on the first semiconductor device 10 via the adhesive layer 22, such as a die attach film, with part of the second semiconductor device 20 projecting from the outer edge of the first semiconductor device 10. That is, the second semiconductor device 20 after mounted has an area 20a which is superposed on the first semiconductor device 10 (common area where the two devices are superposed on each other when viewing from the top), and a projection part 20b which projects from the outer edge of the first semiconductor device 10. The second analog cell 21b of an analog system circuit is a circuit area which is easy to generate heat at a temperature higher than that of the first analog cell 21a, and which has a higher temperature while in operation as compared with the first analog cell 21a. Because of this, the first analog cell 21a and the second analog cell 21b are arranged as shown in FIG. 2, and in particular, the second analog cell 21b is arranged so as to include the projection part 20b of the second semiconductor device 20.

Each cell is provided with a plurality of the pad electrodes 23a and 23b, respectively, to communicate a signal with the outside of the semiconductor device. Herein, the pad electrode 23a is arranged along the outer edge part of the second semiconductor device 20, and the pad electrode 23b is arranged along the outer edge of the first semiconductor device 10 within the area 20a where the first semiconductor device 10 and the second semiconductor device 20 are superposed on each other. With the pad electrodes arranged in this way, when performing wire bonding with the pad electrode 23b of the second analog cell 21b, damage to the edge portion including the second analog cell 21b can be reduced as compared with the case where the pad electrode 23b is formed along the outer edge of the projection part 20b, because the pressure caused by a bonding tool is supported by the first semiconductor device 10.

The pad electrodes 23a and 23b in each cell are electrically connected with the pad electrodes 43 on the upper surface of the wiring board 40 by the bonding wires 24a and 24b made of gold or the like.

An analog system circuit collectively refers to circuits which use a signal of an analog value as data, and examples thereof include a driver amplifier circuit (motor drive current generation output circuit), a transmission system high-output circuit, an output control logic circuit, an analog filter circuit, a pre-drive circuit (small signal amplification circuit), and a protection circuit or the like. Among them, a driver amplifier circuit and a transmission system high-output circuit can be cited as the second analog cell 21*b*.

The sealing resin layer 50 is formed so as to cover the whole surface on the wiring board 40, and seals the first semiconductor device 10 and the second semiconductor device 20. A material of the sealing resin layer 50 is, for example, a thermosetting insulating resin, such as an epoxy resin. This sealing resin layer 50 has a function to protect each semiconductor device from the outside environment. Herein, the sealing resin layer 50 is formed so that the distance L1 between the edge portion of the second semiconductor device including the second analog cell 21*b*, and the outer wall surface of the sealing resin layer 50 which corresponds thereto, is shorter than the distances L2 to L4 in the edge portions other than the above edge portion, as shown in FIG. 2. In addition, a filler for enhancing the thermal conductivity may be added into the sealing resin layer 50.

The first semiconductor device 10 is one embodiment of "a first semiconductor device" of the present invention; the first analog cell 21*a*, "a first circuit area"; the second analog cell 21*b*, "a second circuit area"; the second semiconductor device 20, "a second semiconductor device"; the projection part 20*b*, "a projection part"; the sealing resin layer 50, "a resin layer"; and the pad electrode 23*b*, "an electrode portion", respectively.

The effect of heat release of the projection part 20*b* of the second semiconductor device 20 will be described below, in which the second semiconductor device 20 is stacked on the first semiconductor device 10 with the projection part 20*b* projecting from the outer edge of the first semiconductor device 10.

Figure 4:
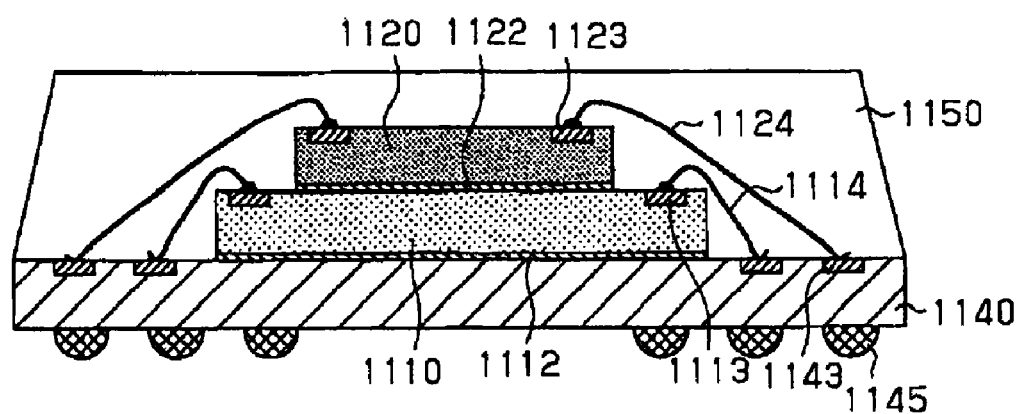
FIG. 4 is a schematic section showing a semiconductor apparatus having a conventional stack structure.

In a semiconductor apparatus having a conventional stack structure shown in FIG. 4, the heat generated by a second semiconductor device (a second semiconductor chip 1120) while in operation, is dominantly released by heat conduction to the sealing resin layer (the sealing resin layer 1150) which is formed on the sides of the upper and side surfaces of the second semiconductor device, because the above heat is difficult to be released downwardly, due to the temperature difference between the first semiconductor device and the second semiconductor device becoming small, thanks to the heat generated by the first semiconductor device (the first semiconductor chip 1110) which is placed below the second semiconductor device. Depending on a calorific value of the first semiconductor device, the second semiconductor device placed directly above the first semiconductor device is, in some cases, heated by the heat, causing the heat release from the second semiconductor to be insufficient.

On the other hand, in a semiconductor device according to the present embodiment, the heat generated by the second semiconductor device while in operation is released by heat conduction to the sealing resin layer 50 formed on the sides of above, side, and under surfaces, because the first semiconductor device 10 does not exist under the projection part 20*b* of the second semiconductor device. Furthermore, the projection part 20*b* is less influenced by the heat generated in the first semiconductor device 10 while in operation as compared with the other area 20*a* where the two devices are superposed on each other, because the projection part 20*b* is more distant from the first semiconductor device 10. Therefore, in the projection part 20*b*, the heat generated by the second semiconductor device 20 can be efficiently released.

(Manufacturing Method)

Figure 3A:
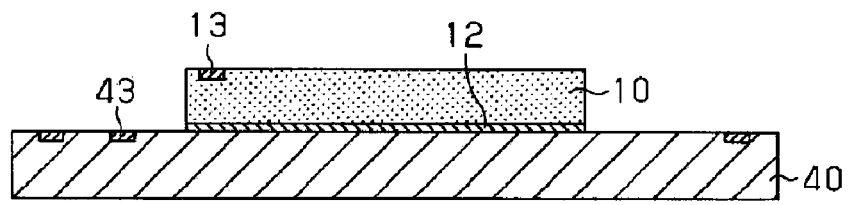
FIGS. 3A to 3C are schematic sections illustrating a process for manufacturing a semiconductor apparatus having semiconductor devices built according to the present embodiment.
Figure 3B:
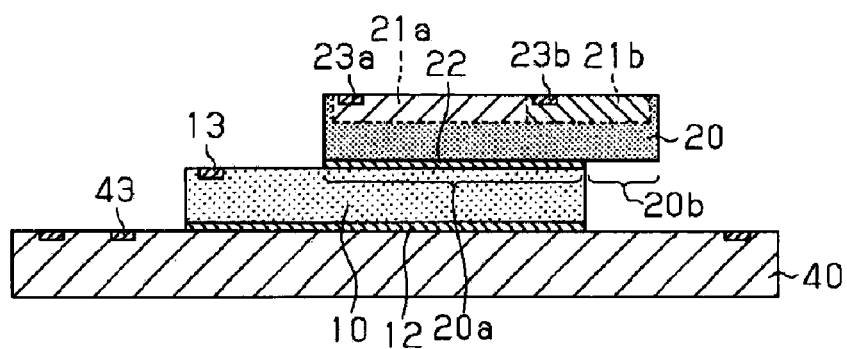
Figure 3C:
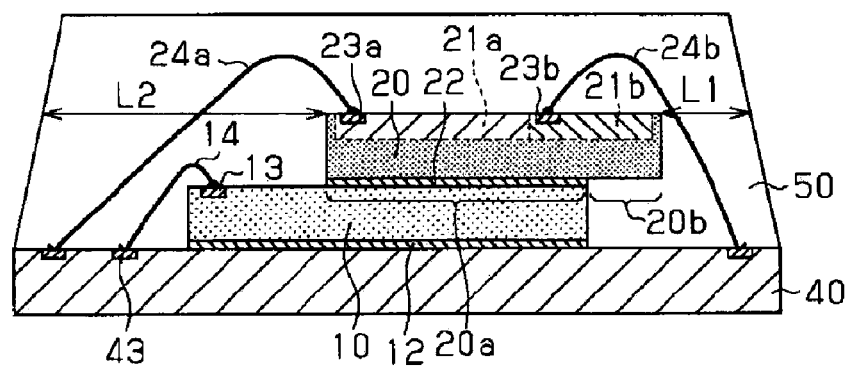

FIG. 3 is a schematic section illustrating a process of manufacturing a semiconductor apparatus having semiconductor devices built according to the first embodiment.

As shown in FIG. 3A, a wiring board 40 is first prepared, in which the wiring board has a multi-layer structure (not shown) in which a plurality of wiring layers and insulating layers are alternately formed using conventional techniques, with a plurality of pad electrodes 43 made of copper, nickel and gold, being formed on the upper surface (semiconductor device mounting surface). A first semiconductor device 10 is then prepared in the following way where a digital system circuit (not shown) and the pad electrode 13 are formed on the upper surface of a semiconductor substrate, such as p-type silicon substrate, by similarly using conventional techniques, and further the pad electrode 13 being formed on the peripheral part of the substrate. The first semiconductor device 10 is mounted in a predetermined area on the wiring board 40 via an adhesive layer 12, such as a die attach film.

As shown in FIG. 3 (B), a second semiconductor device 20 is prepared in which an analog system circuit including a first analog cell 21*a* and a second analog cell 21*b* (circuit area which is easy to generate heat at a temperature higher than that of the first analog cell 21*a*), and a pad electrode 23*a* and a pad electrode 23*b* which are arranged in a predetermined position in each cell, are formed on a semiconductor substrate, such as p-type silicon substrate, using conventional techniques. The second semiconductor device 20 is then mounted on the first semiconductor device 10 via an adhesive layer 22, such as a die attach film. At the time, the second semiconductor device 20 is built so that part of the device 20 (the whole or part of the second analog cell 21*b*) projects from the outer edge of the first semiconductor device 10. Thereby, the second semiconductor device 20 is divided into an area 20*a* where the two devices are superposed on each other, and a projection part 20*b* which projects from the outer edge of the first semiconductor device 10, and the second analog cell 21*b* is arranged so as to include the projection part 20*b*. In addition, a pad electrode 23*b* in the second analog cell 21*b* is formed in a predetermined position (position along the outer edge part of the first semiconductor device 10) in the area 20*a* where the two devices are superposed on each other.

As shown in FIG. 3 (C), the pad electrode 13 of the first semiconductor device 10, and the pad electrode 43 formed on the upper surface of the wiring board 40 are electrically connected together by a bonding wire 14 made of gold or the like. A pad electrode 23*a* of the first analog cell 21*a* and a pad electrode 23*b* of the second analog cell 21*b* in the second semiconductor device 20, are electrically connected with corresponding pad electrodes 43, respectively, by bonding wires 24*a* and 24*b* made of gold or the like. Because the first semiconductor device 10 is located under the lower layer of the pad electrode 23*b* of the second analog cell 21*b*, and the pressure, which occurs by a bonding tool when performing wire bonding with the pad electrode 23 of the second analog 21*b*, is supported by the first semiconductor device 10, the damage to the edge portion including the second analog cell 21*b* can be reduced as compared with the case where the first semiconductor device 10 is not located thereunder (the pad electrode 23*b* is formed along the outer edge of the projection part 20*b*).

The sealing resin layer 50 is formed so that the whole surface on the wiring board 40 is covered, in order to protect the first semiconductor device 10 and the second semiconductor device 20 which are mounted on the wiring board 40.

A thermosetting insulating resin, for example, an epoxy resin or the like, may be adopted for a sealing resin layer 50, and a filler for improving thermal conductivity may be added into the sealing resin layer 50. A positional relationship between the wiring board 40 and the second semiconductor device 20 is controlled so that the distance L1 between the edge portion of the second semiconductor device including the second analog cell 21b, and the side wall surface of the sealing resin layer 50 corresponding thereto, is shorter than the distances L2 to L4 between the outer edge on three sides of the device excluding the analog cell 21b, and the resin layer corresponding thereto.

As shown in FIG. 1, an external connection terminal (solder ball) 45, which is electrically connected with the pad electrode 43 via an internal wiring layer (not shown), is finally formed on the undersurface of the wiring board 40 (surface opposite to the semiconductor device mounting surface) using the solder printing method.

With these processes, a semiconductor apparatus according to the present embodiment shown in the above FIG. 1, can be manufactured.

The semiconductor apparatus according to the present embodiment has the following effects.

(1) With the second analog cell 21b of the second semiconductor device, which is easy to generate heat at a higher temperature, being arranged in an area including the projection part 20b which projects from the outer edge of the first semiconductor device 10, the heat generated by the second analog cell 21b can be released from the back surface of the projection part 20b in addition to the release from the upper surface and the side surface. Because of this, the heat release capability of a semiconductor apparatus is increased as compared with the case where the second semiconductor device 20 never projects from the outer edge of the first semiconductor device 10 (release only from the upper surface and the side surface), which contributes to the stable operation of a semiconductor apparatus. Therefore, the reliability of a semiconductor apparatus can be improved.

(2) With the distance L1 between the edge portion of the second semiconductor device 10 including the second analog 21b, and outer wall surface of the sealing resin layer 50 corresponding thereto, being shorter than the distances L2 to L4 at the three sides other than the above side, the edge portion including the second analog cell 21b is easy to be cooled by the influence of the external environment (external temperature of a semiconductor apparatus) as compared with other edge portions. Because of this, the second analog cell 21b included in such an edge portion can be effectively cooled, which contributes to the stable operation of a semiconductor apparatus. Therefore, the reliability of a semiconductor apparatus can be improved.

(3) With the pad electrode 23b which corresponds to the second analog cell 21b, being arranged in the area 20a where the first semiconductor device 10 and the second semiconductor device 20 are superposed on each other, damage to the edge portion including the analog cell 20b can be reduced because the first semiconductor device 10 supports the pressure, which is caused by a bonding tool when performing wire bonding with the pad electrode 23b, as compared with the case where the pad electrode 23b is formed in the projection part 20b. Because of this, when the second analog cell 21b rises abruptly in its temperature, the semiconductor apparatus can be prevented from thermal destruction caused by the damage. Therefore, the reliability of a semiconductor apparatus can be improved.

Second Embodiment

Figure 5:
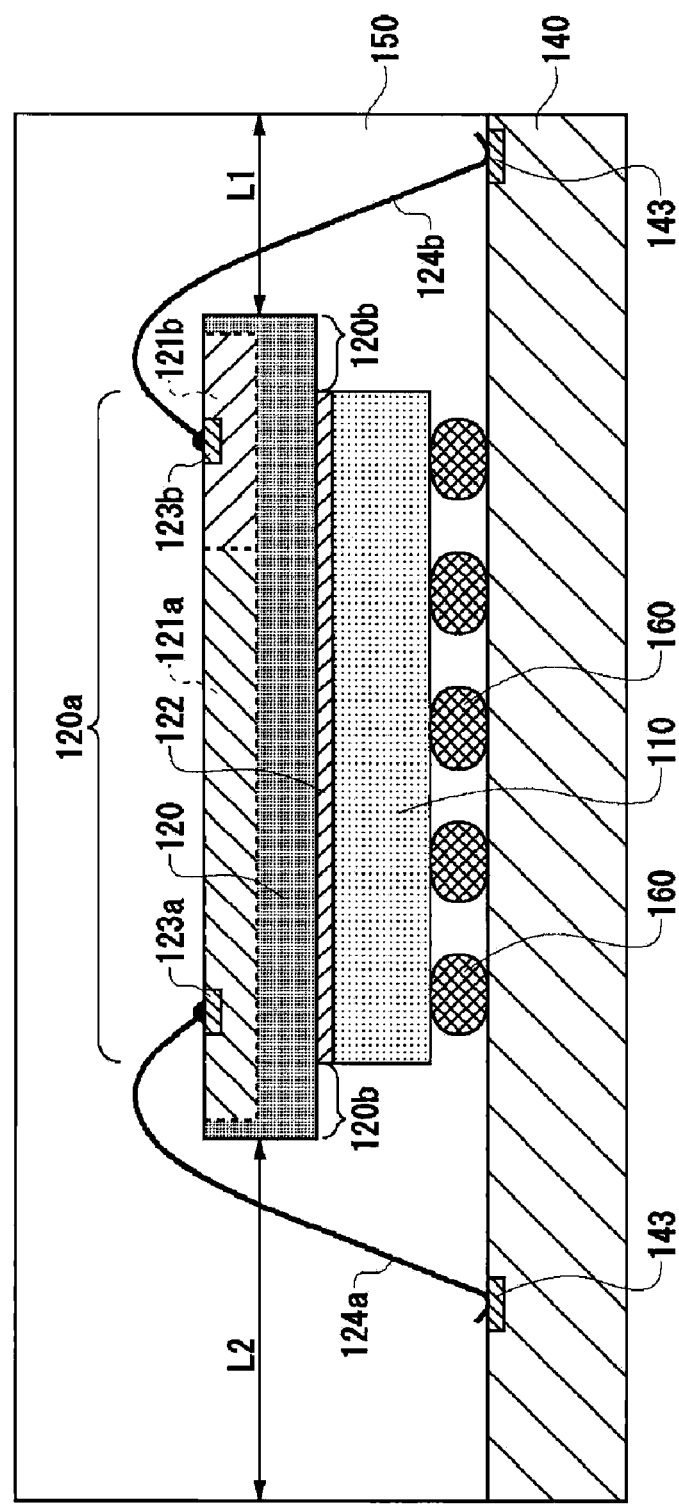
FIG. 5 is a schematic section of a semiconductor apparatus having semiconductor devices built according to the second embodiment.
Figure 6:
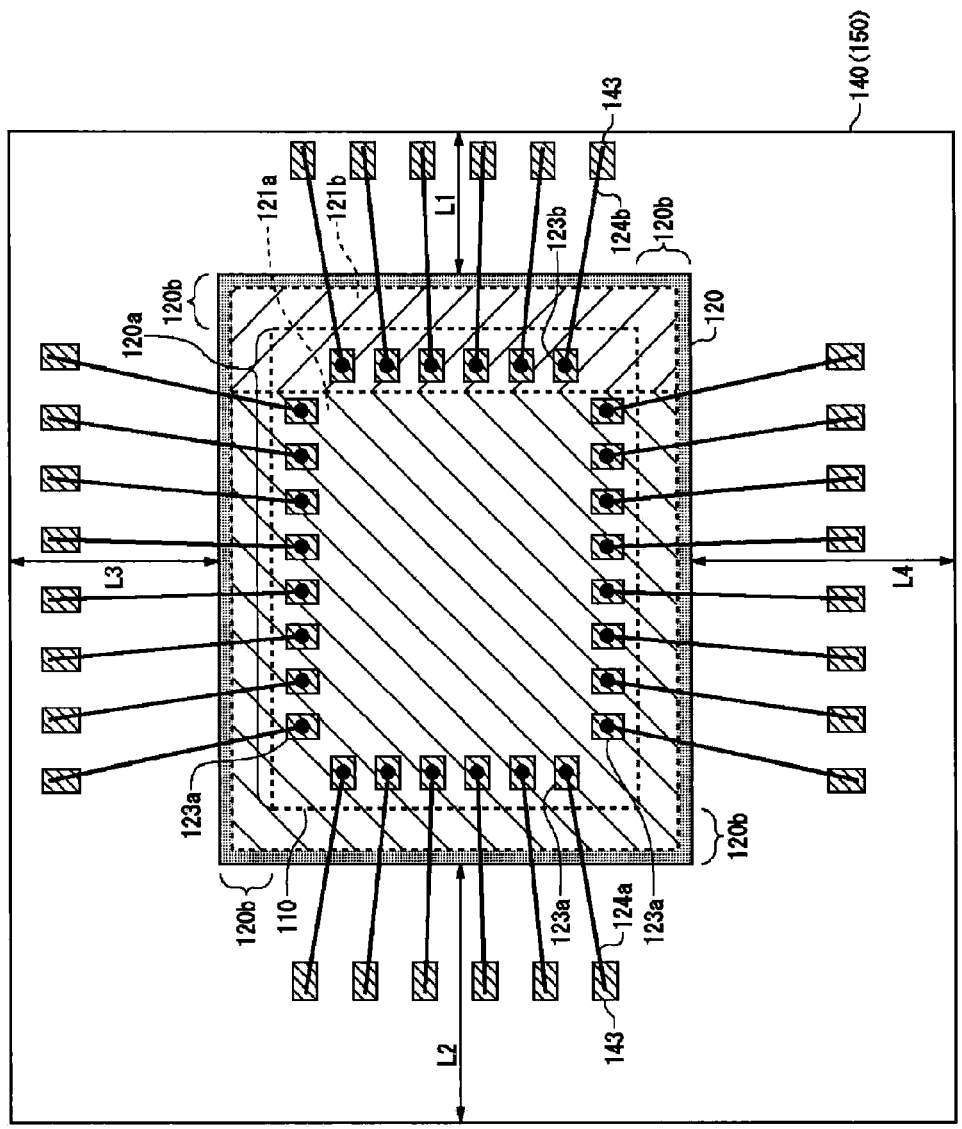
FIG. 6 is a plan view of the semiconductor apparatus according to the second embodiment.

FIG. 5 is a schematic section of a semiconductor apparatus having semiconductor devices built according to the second embodiment, and FIG. 6 is a plan view (top view) of the same. A semiconductor apparatus according to the second embodiment greatly differs from the apparatus according to the first embodiment in the fact that a projection part of the apparatus according to the second embodiment projects in four sides thereof, while that of the apparatus according to the first embodiment projects in one side thereof.

A semiconductor apparatus according to the present embodiment includes: a wiring board 140; a first semiconductor device 110 mounted on the wiring board 140; a second semiconductor device 120 which is stacked on the first semiconductor device 110 and a projection part 120b thereof projects from the outer edge of the four sides of the first semiconductor device 110, respectively; and a sealing resin layer 150 which seals each semiconductor device. And the second semiconductor device 120 has thereon a first analog cell 121a and a second analog cell 121b which is easy to generate heat at a temperature higher than that of the first analog cell 121a, and the second analog cell 121b is arranged so as to include a projection part 120b of the second semiconductor device 120. The first analog cell 121a and the second analog cell 121b may be on the undersurface or on the periphery edge portion of the second semiconductor device 120, without being limited to the upper surface thereof. A description with respect to the wiring board 140 is omitted because it is the same as that in the first embodiment.

The first semiconductor device 110 is a semiconductor device in which, for example, a digital system circuit (not shown) is formed on the upper surface (surface) of semiconductor substrates, such as p-type silicon substrate. With a plurality of bumps 160 (projecting electrode terminals) formed in the shape of an array on the undersurface of the first semiconductor device 110, which is opposite to the upper surface where the second semiconductor device 120 is built, the first semiconductor device 110 is electrically connected with the wiring board 140 via the bumps 160. With such so-called flip chip mounting, a second semiconductor device 120 having four sides which are longer than that of a first semiconductor device 110, respectively, can be stacked on the first semiconductor device 110 so that the four sides thereof project from the outer edge of the first semiconductor device 110, respectively.

The second semiconductor device 120 is one where an analog system circuit including the first analog cell 121a and the second analog cell 121b is formed on the upper surface (surface) of a semiconductor substrates, for example, p-type silicon substrate etc. The second semiconductor device 120 is mounted on the first semiconductor device 110 via the adhesive layer 122, such as a die attach film, with the four sides thereof projecting from the outer edge of the first semiconductor device 110. That is, the second semiconductor device 120 mounted has an area 120a which is superposed on the first semiconductor device 110 (common area where the two devices are superposed on each other when viewing from the top), and a projection part 120b which projects from the outer edge of the first semiconductor device 110. The second analog cell 121b of an analog system circuit is a circuit area which is easy to generate heat at a temperature higher than that of the first analog cell 121a. Because of this, the first analog cell 121a and the second analog cell 121b are arranged as shown in FIG. 6, and in particular, the second analog cell 121b is arranged so as to include the projection part 120b of the second semiconductor device 120.

Each cell is provided with a plurality of the pad electrodes 123a and 123b, respectively, to communicate a signal with the outside of the semiconductor device. Herein, the pad electrode 123a is arranged along the outer edge part of the area 120a where the second semiconductor device 120 and the first semiconductor device 110 are superposed on each other, within the area where the first analog cell 121a is formed, while the pad electrode 123b is arranged along the outer edge of the first semiconductor device 110, within the area where the second analog cell 121b is formed. With the pad electrodes arranged in this way, when performing wire bonding with the pad electrode 123b of the second analog cell 121b, damage to the edge portion including the second analog cell 121b can be reduced as compared with the case where the pad electrode 123b is formed along the outer edge of projection part 120b, because the pressure caused by a bonding tool is supported by the first semiconductor device 110.

The pad electrodes 123a and 123b in each cell are electrically connected with the pad electrodes 143 on the upper surface of the wiring board 140 by the bonding wires 124a and 124b made of gold or the like.

An analog system circuit collectively refers to circuits which use a signal of an analog value as data, and examples thereof include a driver amplifier circuit (motor drive current generation output circuit), a transmission system high-output circuit, an output control logic circuit, an analog filter circuit, a pre-drive circuit (small signal amplification circuit), and a protection circuit or the like. Among them, a driver amplifier circuit and a transmission system high-output circuit can be cited as the second analog cell 121b.

The sealing resin layer 150 is formed so as to cover the whole surface on the wiring board 140, and seals the first semiconductor device 110 and the second semiconductor device 120. A material of the sealing resin layer 150 is, for example, a thermosetting insulating resin, such as an epoxy resin. This sealing resin layer 150 has a function to protect each semiconductor device from the outside environment. Herein, the sealing resin layer 150 is formed so that the distance L1 between the edge portion of the second semiconductor device 120 including the second analog cell 121b, and the side wall (outer wall) which corresponds thereto, is shorter than the distances L2 to L4 in the edge portions other than the above edge portion, as shown in FIG. 6. In addition, a filler for enhancing the thermal conductivity may be added into the sealing resin layer 150.

The first semiconductor device 110 is one embodiment of "a first semiconductor device" of the present invention; the first analog cell 121a, "a first circuit area"; the second analog cell 121b, "a second circuit area"; the second semiconductor device 120, "a second semiconductor device"; the projection part 120b, "a projection part"; the sealing resin layer 150, "a resin layer"; and the pad electrode 123b, "an electrode portion", respectively.

The effect of heat release of the projection part 120b of the second semiconductor device 120 will be described below, in which the second semiconductor device 120 is stacked on the first semiconductor device 110 with the projection part 120b projecting from the outer edge of the first semiconductor device 110.

In a semiconductor apparatus according to the present embodiment, the first semiconductor device 110 does not exist not only under the projection part in one side of the second semiconductor device as with the semiconductor apparatus in the first embodiment, but also under the projection part 120b in four sides of the second semiconductor device 120. Therefore, the heat generated by the second semiconductor device 120 while in operation is released by heat conduction to the sealing resin layer 150 formed on the sides of above, side, and undersurface. Furthermore, the projection part 120b is less influenced by the heat generated in the first semiconductor device 110 while in operation as compared with other area 120a where the two devices are superposed on each other, because the projection part 120b is more distant from the first semiconductor device 110. Therefore, in projection part 120b, the heat generated by the second semiconductor device 120 can be efficiently released.

Third Embodiment

Figure 7:
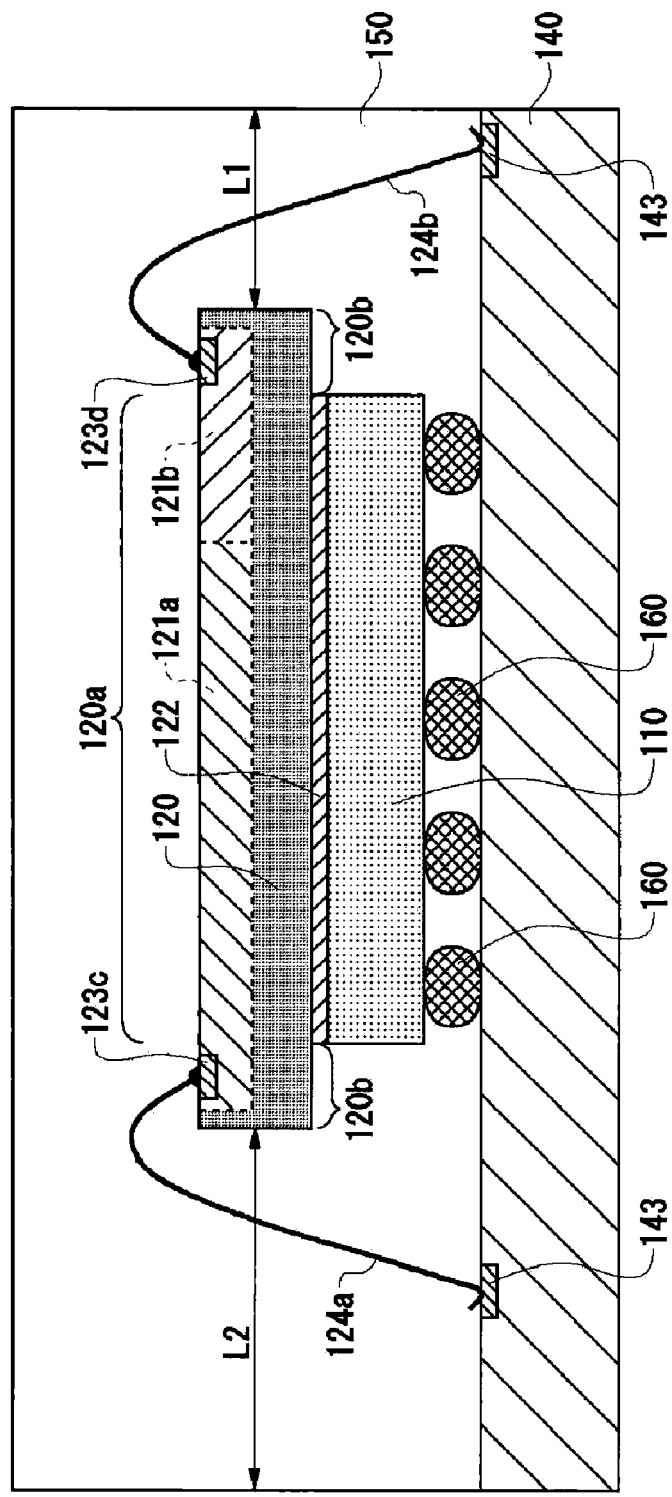
FIG. 7 is a schematic section of a semiconductor apparatus having semiconductor devices built according to the third embodiment.
Figure 8:
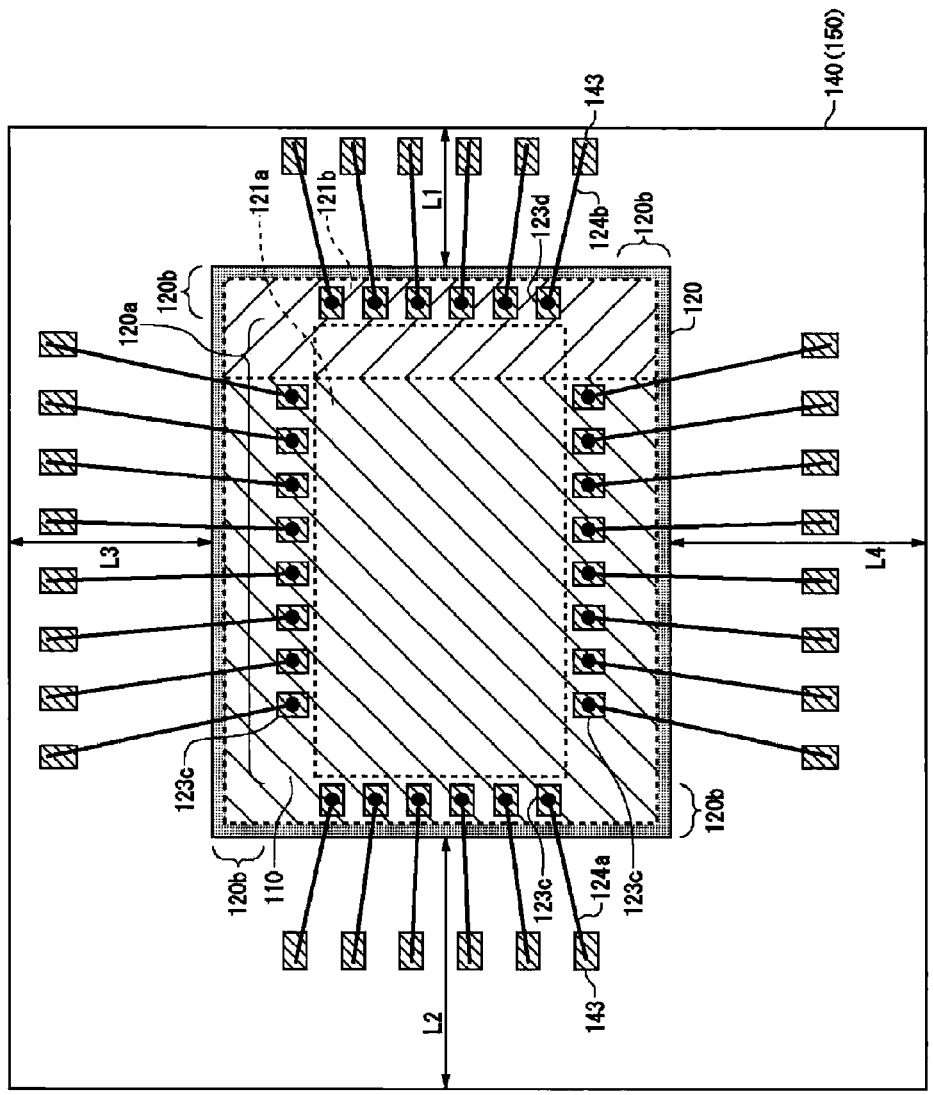
FIG. 8 is a plan view of the semiconductor apparatus according to the third embodiment.

FIG. 7 is a schematic section of a semiconductor apparatus having semiconductor devices built according to the third embodiment, and FIG. 8 is a plan view (top view) of the same. A semiconductor apparatus according to the third embodiment greatly differs from the apparatus according to the second embodiment in the fact that a pad electrode is arranged in a projection part of the second semiconductor device, while a pad electrode is arranged in an area where the two devices are superposed on each other in the semiconductor apparatus according to the second embodiment. A description with respect to other aspects is appropriately omitted because of their having the same structures as with the second embodiment.

A semiconductor apparatus according to the present embodiment is provided with a plurality of the pad electrodes 123c and 123d for communicating a signal with the outside of the semiconductor device, in a first analog cell 121a and a second analog cell 121b, respectively. The pad electrode 123c is arranged along the outer edge part of a projection part 120b within the area where the first analog cell 121a is formed, while the pad electrode 123d is arranged along the outer edge part of a projection part 120b within the area where the second analog cell 121b is formed. With the pad electrodes arranged in this way, the heat generated by the pad electrode 123d which is easy to become a heating body among the second analog cell 121b that is easy to generate heat at a higher temperature, can be released also from the back surface of the projection part 120b in addition to the release from the upper surface and side surface. Therefore, the heat release capability of the semiconductor apparatus is increased as compared with the case where the pad electrode 123d is not arranged in the projection part 120b (heat release only from the upper surface and the side surface), which contributes to the stable operation. Therefore, the reliability of the semiconductor apparatus can be improved.

Fourth Embodiment

Figure 9:
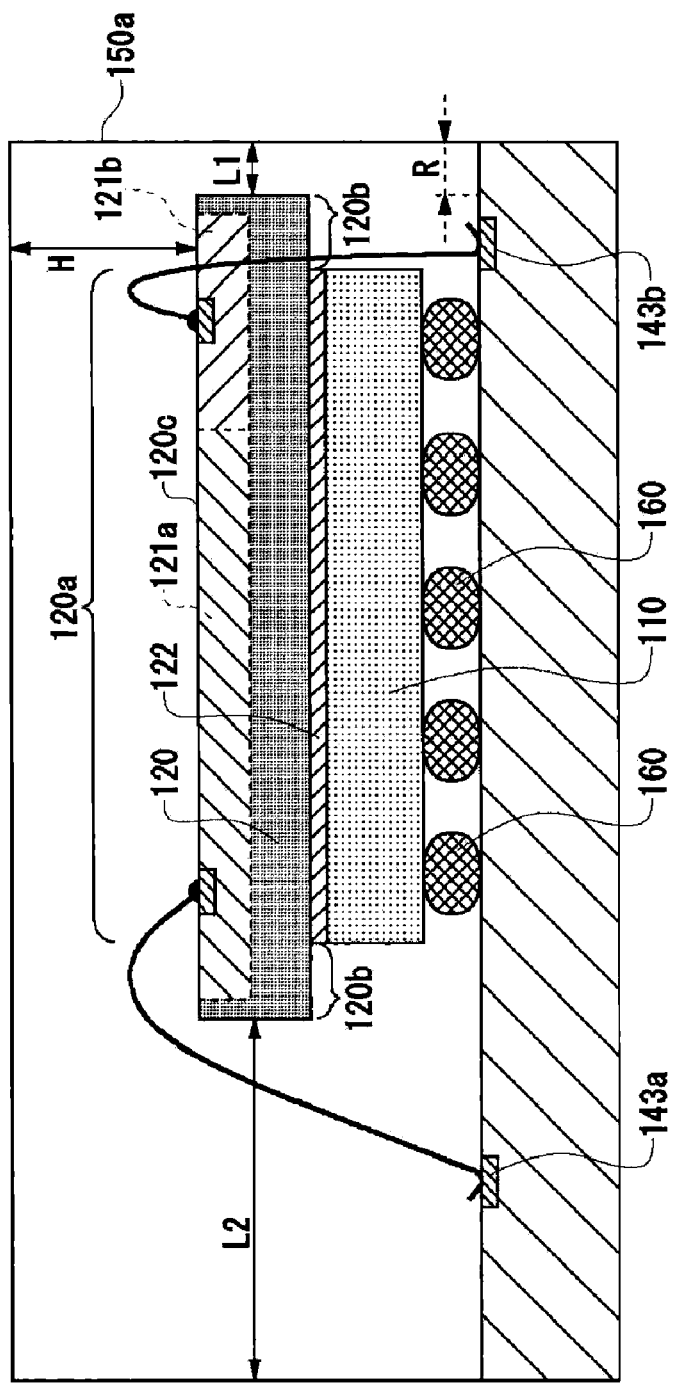
FIG. 9 is a schematic section of a semiconductor apparatus having semiconductor devices built according to the fourth embodiment.
Figure 10:
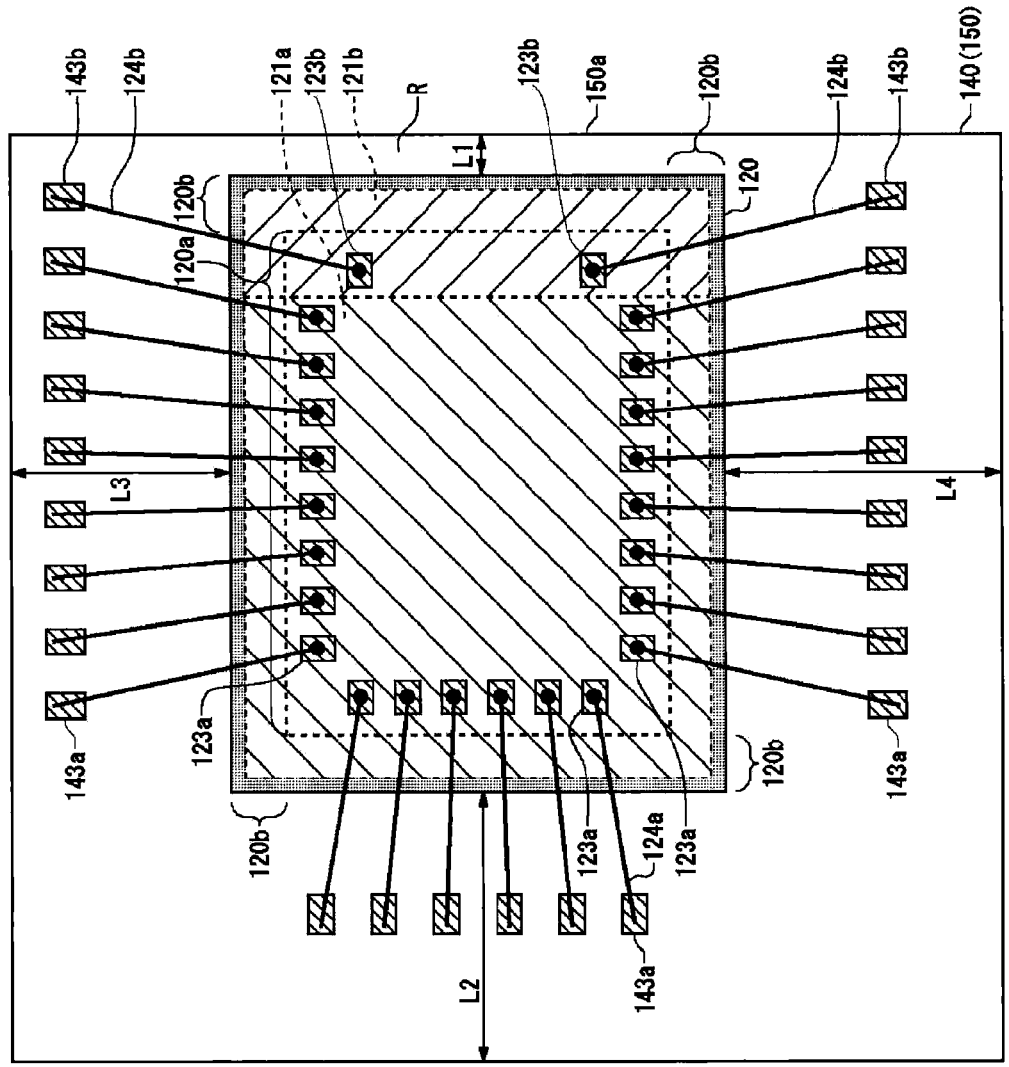
FIG. 10 is a plan view of the semiconductor apparatus according to the fourth embodiment.

FIG. 9 is a schematic section of a semiconductor apparatus having semiconductor devices built according to the fourth embodiment, and FIG. 10 is a plan view (top view) of the same. A semiconductor apparatus according to the fourth embodiment greatly differs from the apparatus according to the second embodiment in the fact that a pad electrode on the substrate, which is connected with the pad electrode in the second analog cell via a bonding wire, is formed in an area other than the area between the second analog cell and the side wall surface of the sealing resin layer corresponding thereto. A description with respect to other aspects is appropriately omitted, because of their having almost the same structures as with the second embodiment.

A semiconductor apparatus according to the present embodiment is provided with a plurality of the pad electrodes 123a and 123b for communicating a signal with the outside of the semiconductor device, in a first analog cell 121a and a second analog cell 121b, respectively. The pad electrode 123a is arranged along the outer edge part of an area where the two devices are superposed on each other within the area where the first analog cell 121a is formed, while the pad electrode 123b is arranged along the outer edge of the first semiconductor device 110 within the area where the two devices are superposed on each other in the area where the second analog cell 121a is formed. With the pad electrodes arranged in this way, when performing wire bonding with the pad electrode 123b of the second analog cell 121b, damage to the edge portion including the second analog cell 121b can be reduced as compared with the case where the pad electrode 123b is formed along the outer edge of projection part 120b, because the pressure caused by a bonding tool is supported by the first semiconductor device 110.

In the semiconductor apparatus according to the present embodiment, the pad electrode 123b of the second analog cell 121b is electrically connected with the pad electrode 143b on the upper surface of the wiring board 140 via the bonding wire 124b, while the pad electrode 123a of the first analog cell 121a is electrically connected with the pad electrode 143a on the upper surface of the wiring board 140 via the bonding wire 124a. Herein, the pad electrode 143b of the wiring board 140, with which the bonding wire 124b is connected, is formed in an area other than the area R between the projection part 120b including the second analog sell 121b and the side wall surface 150a of the sealing resin layer 150 corresponding thereto. With the pad electrode 143b arranged in this way, the heat generated by the second analog cell 121b can be efficiently released from the side wall surface 150a as compared with the case where the pad electrode 143b is formed in the area between the second analog cell 121b and the side wall surface 150a, because the second analog cell 121b can be provided more closely to the side wall surface 150a.

Also, the semiconductor apparatus according to the present invention is structured so that the distance L1 between the projection part 120b including the second cell 121b and the side wall surface 150a of the sealing resin layer 150 corresponding thereto, is shorter than the distance H between the upper surface 120c of the second semiconductor device 120 and the upper surface 150b of the sealing resin layer 150. With the semiconductor apparatus structured in this way, the heat generated by the second analog cell 121b can be efficiently released from the side wall surface 150a as compared with the case where the distance L1 between the second analog cell 121b and the side wall surface 150a of the sealing resin layer 150, is longer than the distance H between the upper surface 120c of the second semiconductor device 120 and the upper surface 150b of the sealing resin layer 150.

Fifth Embodiment

A description will now be given of a mobile apparatus provided with the afore-mentioned semiconductor apparatus. While a cell phone is described to exemplify mobile apparatuses, the inventive apparatus may also be applied to electronic apparatuses such as personal digital assistants (PDA), digital video cameras (DVC) and digital still cameras (DSC).

Figure 11:
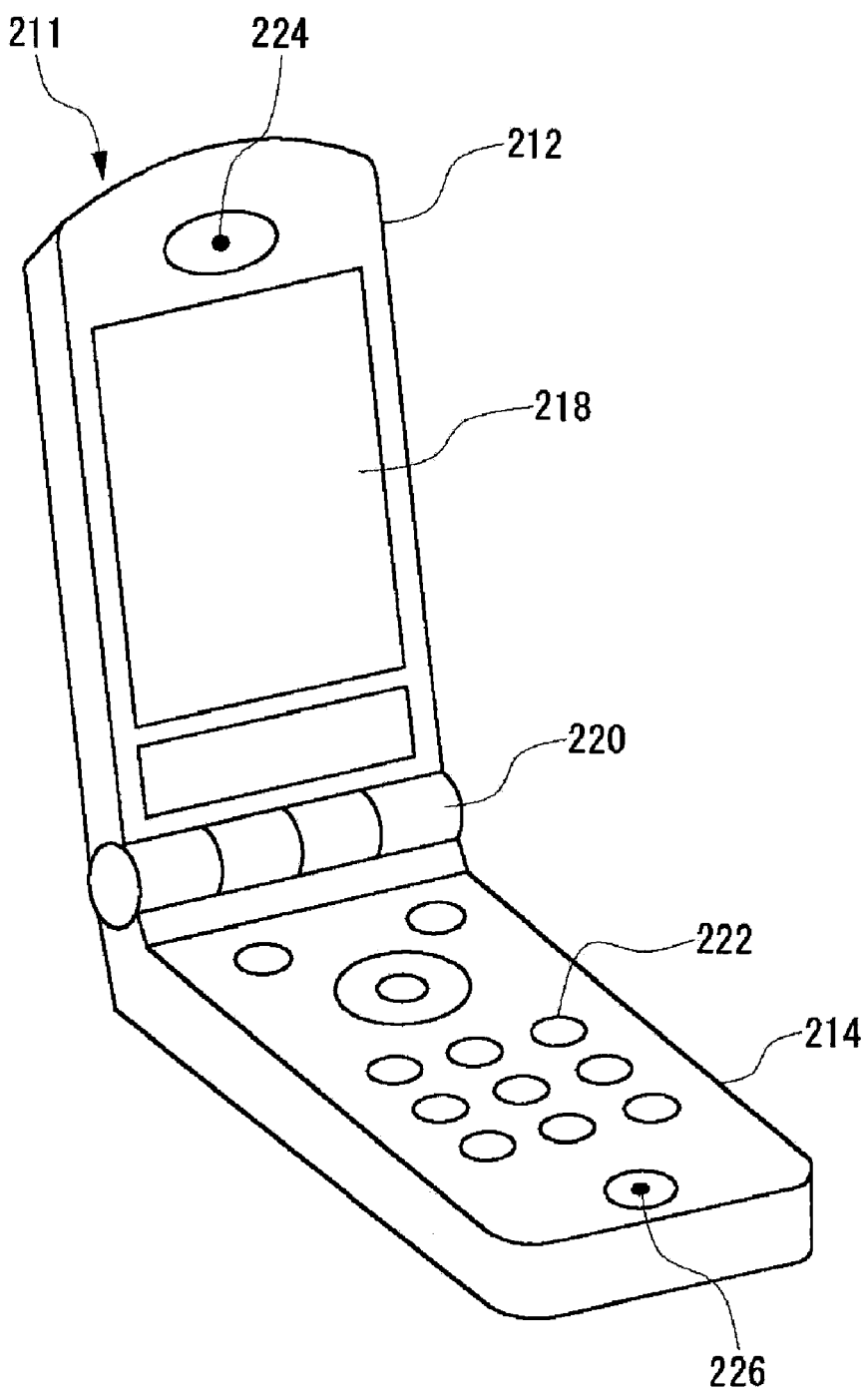
FIG. 11 is a diagram showing a structure of a cell phone according to the fifth embodiment.

FIG. 11 is a diagram showing a structure of a cell phone provided with a semiconductor apparatus according to the present embodiment. A cell phone 211 is structured so that a first housing 212 and a second housing 214 are connected via a movable part 220. The first housing 212 and the second housing 214 are movable around the movable part 220. The first housing 212 is provided with a display unit 218 for displaying information including characters and images, and with a speaker unit 224. The second housing 214 is provided with a control unit 222 (e.g. control buttons) and a microphone unit 226. The semiconductor apparatus according to the above embodiments is mounted inside the cell phone 211.

Figure 12:
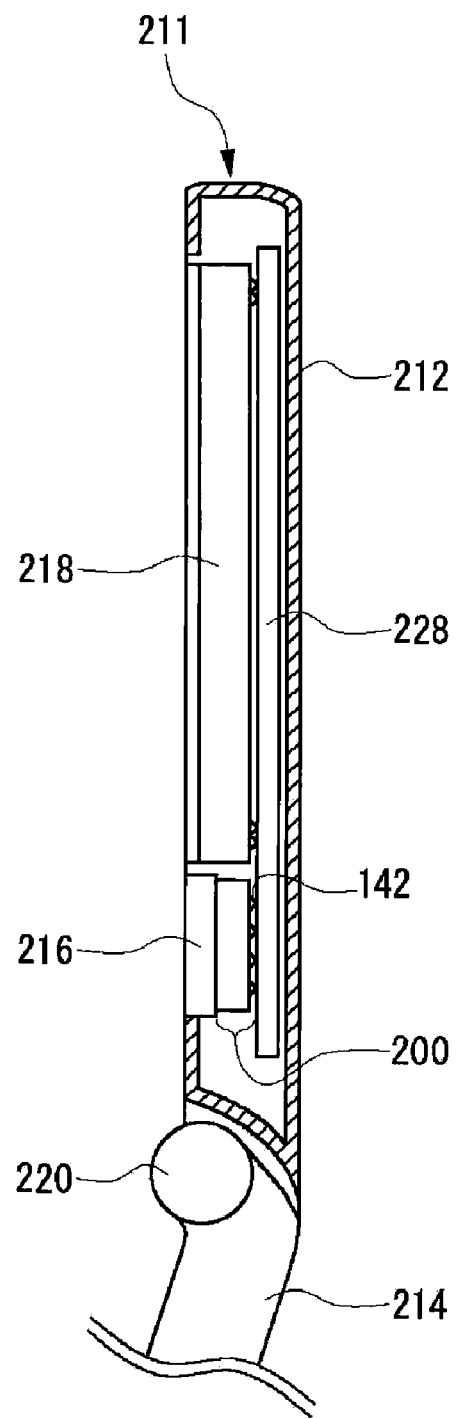
FIG. 12 is a partial section of the cell phone shown in FIG. 11.

FIG. 12 is a partial section of the cell phone shown in FIG. 11 (section of the first housing 212). The semiconductor apparatus 200 according to the embodiments is mounted on a printed board 228 via a solder bump 142, and electrically connected with, for example, the display unit 218 via the printed board 228. The underside of the semiconductor apparatus 200 (surface opposite to the solder bump 142) is provided with a heat spreader 216 such as a metal plate. For example, heat generated by the semiconductor apparatus is prevented from collected inside the first housing 212 and is released outside the first housing 212 efficiently.

The mobile apparatus provided with the semiconductor apparatus 200 according to the present embodiments, can acquire not only stabilized operation therewithin, but also less noise released outside the semiconductor apparatus, which can reduce the influence of the noise on other parts mounted inside the mobile apparatus. Because of these advantages, the reliability of a mobile apparatus provided with such a semiconductor apparatus 200 can be improved.

These embodiments are intended to be illustrative only and it will be obvious to those skilled in the art that various modifications could be developed based on the knowledge of a skilled person and that such modifications are also within the scope of the present invention.

In the above embodiments, a sealing resin layer for sealing each semiconductor device is formed in a semiconductor apparatus by way of example, but the present invention is not limited to the embodiments. For example, a sealing resin layer is not necessarily required to be formed, and a semiconductor apparatus without a sealing resin layer may be possible. In the case, the generated heat can be released effectively, because the undersurface of a projection part is directly exposed to the air.

In the above embodiments, a semiconductor apparatus in which two semiconductor devices are built, is illustrated by way of example, but the present invention is not limited to the embodiments. For example, the present invention may be applied to a semiconductor apparatus in which three or more semiconductor devices are built. Alternatively, the present invention may be applied to a semiconductor apparatus in which a plurality of semiconductor devices are stacked on a semiconductor device. In the case, the above advantages can also be provided between each semiconductor device.

In the above embodiments, a semiconductor device in which an analog system circuit is formed in a second device, is illustrated by way of example, but the present invention is not limited to the embodiments. For example, the present invention may be applied to a semiconductor device in which an analog system circuit and a digital system circuit are formed (semiconductor device mounted with analog/digital). In the case, the above advantage can also be provided by arranging a circuit which is easy to generate heat at a higher temperature in a projection part.

In the above embodiments, a semiconductor device in which a digital system circuit is formed in a first semiconductor device, is illustrated by way of example, but the present invention is not limited to the embodiments. For example, the present invention may be applied to a semiconductor device in which a digital system circuit and an analog system circuit are formed (semiconductor device mounted with analog/digital). In this case, it is preferable that an analog system circuit is optionally provided in an area where a second semiconductor device is not mounted. It is known that a transistor included in an analog system circuit or a digital system circuit generally varies its performance characteristics depending on the influence of stress. In particular, an analog system circuit, which is sensitive to such a variation as compared with a digital system circuit, sometimes varies from a certain performance thereof and does not work in a predetermined way depending on the degree of the stress, when part of a transistor included in the analog circuit receives an unbalanced stress. Because of this, by optionally providing an analog system circuit in an area where a second semiconductor device is not mounted, the analog system circuit can be prevented from receiving an unbalanced stress due to the outer edge part of the second semiconductor device, which can reduce the variation of the circuit characteristics in an analog system circuit. Therefore, the reliability of a semiconductor apparatus having semiconductor devices built can be improved.

In addition, in the step of mounting a second semiconductor device on a first semiconductor device, a load (pressure) to the first semiconductor device, which occurs when mounting the second semiconductor device, is not applied to the analog system circuit, because the analog system circuit is optionally provided in an area where the second semiconductor device is not mounted, thereby variation of the characteristics of an analog system circuit (physical damage to a transistor) can be prevented. Because of this, the manufacturing yield of semiconductor apparatuses having semiconductor devices built can be increased and a semiconductor apparatus can be manufactured at a lower cost.

In the above each semiconductor apparatus, the second analog cell is preferably selected so that an amount of current flowing through the bonding wire connecting the pad electrode included in the second analog cell with the pad electrode provided on the board, is larger than that flowing through the bonding wire connecting the pad electrode included in the first analog cell with the pad electrode provided on the board. Because it can be generally expected that with a larger amount of current, a calorific value in a cell is larger and a temperature becomes higher, each analog cell can be placed at a proper position of the second semiconductor device depending on an amount of current thereof. An amount of current flowing through the bonding wire may be determined by comparing a current average value per a predetermined period. Alternatively, in the case where each analog cell and the substrate are connected by a plurality of wirings, an amount of current may be determined by comparing an average value of current flowing through all wirings. The second analog cell 21b is exemplified as an output circuit with a large average value of an output current.

What is claimed is:

1. A semiconductor apparatus comprising:
   a substrate;
   a first semiconductor device; and
   a second semiconductor device which is stacked on the first semiconductor device and has a projection part projecting from an outer edge of the first semiconductor device,
   wherein the first semiconductor device and the second semiconductor device are arranged on the substrate and are sealed by a resin layer formed on the substrate,
   wherein the second semiconductor device has thereon a first circuit area, and a second circuit area which reaches a higher temperature than the first circuit area, and the second circuit area is arranged so as to include the projection part,
   wherein the resin layer is formed so that a distance between the edge portion including the second circuit area of the second semiconductor device and a side wall surface of the resin layer corresponding thereto, is shorter than that of any other edge portion, and
   wherein an amount of current flowing through a first wiring connecting an electrode portion included in the first circuit area with a terminal provided on the substrate, is lower than that flowing through a second wiring connecting an electrode portion included in the second circuit area with a terminal provided on the substrate.

2. The semiconductor apparatus according to claim 1, wherein the terminal provided on the substrate, with which the second wiring is connected, is provided in an area other than the area between the edge portion including the second circuit area and the side wall surface of the resin layer corresponding thereto.

3. The semiconductor apparatus according to claim 2, wherein the resin layer is formed so that a distance between the edge portion and the side wall surface of the resin layer corresponding thereto, is shorter than that between the upper surface of the second semiconductor device and the upper surface of the resin layer.

4. The semiconductor apparatus according to claim 1, wherein the resin layer is formed so that a distance between the edge portion and the side wall surface of the resin layer corresponding thereto, is shorter than that between the upper surface of the second semiconductor device and the upper surface of the resin layer.

5. The semiconductor apparatus according to claim 1, wherein
   the resin layer is formed so that a distance between the edge portion and the side wall surface of the resin layer corresponding thereto, is shorter than that between the upper surface of the second semiconductor device and the upper surface of the resin layer.

6. The semiconductor apparatus according to claim 1, wherein the second semiconductor device is stacked on the first semiconductor device so that multiple sides of the second semiconductor device project from the outer edge of the first semiconductor device.

7. The semiconductor apparatus according to claim 1, wherein
   the second semiconductor device is stacked on the first semiconductor device so that four sides of the second semiconductor device project from the outer edge of the first semiconductor device.

8. The semiconductor apparatus according to claim 2, wherein
   the second semiconductor device is stacked on the first semiconductor device so that four sides of the second semiconductor device project from the outer edge of the first semiconductor device.

* * * * *